United States Patent
Yang et al.

(10) Patent No.: US 7,476,934 B2
(45) Date of Patent: Jan. 13, 2009

(54) STRUCTURE FOR AN LDMOS TRANSISTOR AND FABRICATION METHOD THEREOF

(75) Inventors: Jia-Wei Yang, Hsinchu (TW); Da-Pong Chang, Shinyi Chiu (TW); Chih-Cherng Liao, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 26 days.

(21) Appl. No.: 11/441,246

(22) Filed: May 26, 2006

(65) Prior Publication Data

US 2006/0220117 A1    Oct. 5, 2006

Related U.S. Application Data

(62) Division of application No. 10/428,940, filed on May 5, 2003, now Pat. No. 7,074,658.

(51) Int. Cl.
*H01L 29/76* (2006.01)

(52) U.S. Cl. ............... 257/335; 257/330; 257/368; 257/341; 257/328; 257/327; 257/343; 257/401

(58) Field of Classification Search ............ 257/393, 257/335, 401, 368, 328, 341, 343
See application file for complete search history.

(56) References Cited

U.S. PATENT DOCUMENTS

| | | | |
|---|---|---|---|
| 5,808,317 A * | 9/1998 | Kuo | 257/66 |
| 6,118,152 A * | 9/2000 | Yamaguchi et al. | 257/347 |
| 6,617,656 B2 | 9/2003 | Lee et al. | |
| 6,906,381 B2 | 6/2005 | Peyre-Lavigne et al. | |
| 2005/0051849 A1 * | 3/2005 | Shimotsusa | 257/368 |
| 2005/0285188 A1 * | 12/2005 | Khemka et al. | 257/338 |

* cited by examiner

*Primary Examiner*—Cuong Q Nguyen
*Assistant Examiner*—Trang Q Tran
(74) *Attorney, Agent, or Firm*—Birch, Stewart, Kolasch & Birch, LLP

(57) ABSTRACT

A structure for an LDMOS transistor has a horseshoe-shaped gate layer formed on an N-type layer of a semiconductor silicon substrate, in which the gate layer comprises a transverse-extending area, a first lengthwise-extending area connected to a left end of the transverse-extending area and a second lengthwise-extending area connected to a right end of the transverse-extending area. A first P-type body is formed in the N-type layer, and overlaps the left periphery of the first lengthwise-extending area of the gate layer. A second P-type body is formed in the N-type layer, and overlaps the right periphery of the second lengthwise-extending area of the gate layer.

7 Claims, 2 Drawing Sheets

STRUCTURE FOR AN LDMOS TRANSISTOR AND FABRICATION METHOD THEREOF

This application is a Divisional of co-pending application Ser. No. 10/428,940, filed on May 5, 2003, and for which priority is claimed under 35 U.S.C. § 120, the entire contents of which are hereby incorporated by reference.

BACKGROUND OF THE INVENTION

1. Field of the Invention

The invention relates to a high-voltage power device, and more particularly to a gate layer and a P body used for an LDMOS transistor.

2. Description of the Related Art

Recently, as the manufacturing techniques of semiconductor integrated circuits have developed, to fulfill requests for the integration of controllers, memories, low-voltage operating circuits and high-voltage power devices on a single chip, to achieve a single-chip system, in which a power device, including vertical diffused MOS (VDMOS) transistor, lateral diffused MOS (LDMOS) transistor and insulated gate bipolar transistor (IGBT), is used to increase power transforming efficiency and decrease wasted energy. The LDMOS transistor compatible with the high-voltage CMOS process is prevalent in the manufacture of high-voltage power devices.

FIG. 1 is a sectional diagram of a conventional LDMOS transistor. In a case of a high-voltage area of a P-type semiconductor silicon substrate 10, an N-type epitaxial layer 12 is provided thereon, and a shallow trench isolation (STI) structure 14 is formed in the N-type epitaxial layer 12 to isolate components within the high-voltage area. An $N^+$-type source region 16 is formed in the N-type epitaxial layer 12 and at one side of the STI structure 14. An $N^+$-type drain region 18 is formed in the N-type epitaxial layer 12 and at the other side of the STI structure 14. A P body 20 is formed in the N-type epitaxial layer 12 to surround the sidewalls and bottom of the $N^+$-type source region 16. A gate insulating layer 22 is deposited on the N-type epitaxial layer 12, and a gate layer 24 is patterned on the gate insulating layer 22. The P body 20 has a lateral extension distance $L_D$ beneath the gate layer 24 and is defined as an effective channel length of the LDMOS transistor.

FIG. 2 is a plane view of the gate layer 24 and the P body 20 shown in FIG. 1. The periphery of the gate layer 24 overlaps the periphery of the P body 20 to provide effective channel length, and the overlapping width A must be precisely controlled to ensure the electrical performance of the LDMOS transistor. Thus, it is very important to modify the width W of the gate layer 24, the width B of the P body 20 and the overlapping width A to achieve demands for narrowed size and lower process cost. However, the limitations in small-size design and thermal budget always cause the overlapping portion to shift, resulting in the effective channel length $L_D$ being to long or too short.

In one approach to the LDMOS transistor, the gate layer 24 is patterned on the gate insulating layer 22 prior to the ion implantation and thermal treatment for forming the P body 20. However, when the width W of the gate layer 24 is narrowed reach 0.351 µm or 0.25 µm, the reduced thermal budget limits the vertical-diffusing distance and the lateral-diffusing distance of the P body 20, thus the overlapping width A cannot achieve the demand for the effective channel length $L_D$.

In another approach to the LDMOS transistor, the processes consisting of ion implantation and thermal treatment for the P body 20 are completed prior to the processes consisting of deposition, photolithography and etching for the gate layer 24. Nevertheless, due to the exposure limitation, the gate layer 24 may shift and fail to precisely control the overlapping width A.

SUMMARY OF THE INVENTION

The present invention is an LDMOS transistor with a horseshoe-shaped gate layer and a pair of P bodies to precisely control an overlapping width between the gate layer and the P body, thus ensuring the effective channel length of the LDMOS transistor.

Accordingly, the present invention provides a structure for an LDMOS transistor. A semiconductor silicon substrate has a surface region of a first conductive type. A horseshoe-shaped gate layer is formed on the semiconductor silicon substrate, in which the gate layer comprises a transverse-extending area, a first lengthwise-extending area connected to a left end of the transverse-extending area and a second lengthwise-extending area connected to a right end of the transverse-extending area. A first source region of the first conductive type is formed in the surface region of the semiconductor silicon substrate and at the left periphery of the first lengthwise-extending area of the gate layer. A second source region of the first conductive type is formed in the surface region of the semiconductor silicon substrate and at the right periphery of the second lengthwise-extending area of the gate layer. A first drain region of the first conductive type is formed in the surface region of the semiconductor silicon substrate and between the first lengthwise-extending area and the second lengthwise-extending area of the gate layer. A first ion-diffusion body of a second conductive type is formed in the surface region of the semiconductor silicon substrate to surround the sidewalls and bottom of the first source region. A second ion-diffusion body of a second conductive type is formed in the surface region of the semiconductor silicon substrate to surround the sidewalls and bottom of the second source region. The left periphery of the first lengthwise-extending area of the gate layer overlaps the periphery of the first ion-diffusion body to form a first overlapping portion, and the right periphery of the second lengthwise-extending area of the gate layer overlaps the periphery of the second ion-diffusion body to form a second overlapping portion.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE DRAWINGS

The present invention will become more fully understood from the detailed description given hereinbelow and the accompanying drawings, which are given by way of illustration only, and thus are not limitative of the present invention.

DETAILED DESCRIPTION OF THE INVENTION

Figure 3:
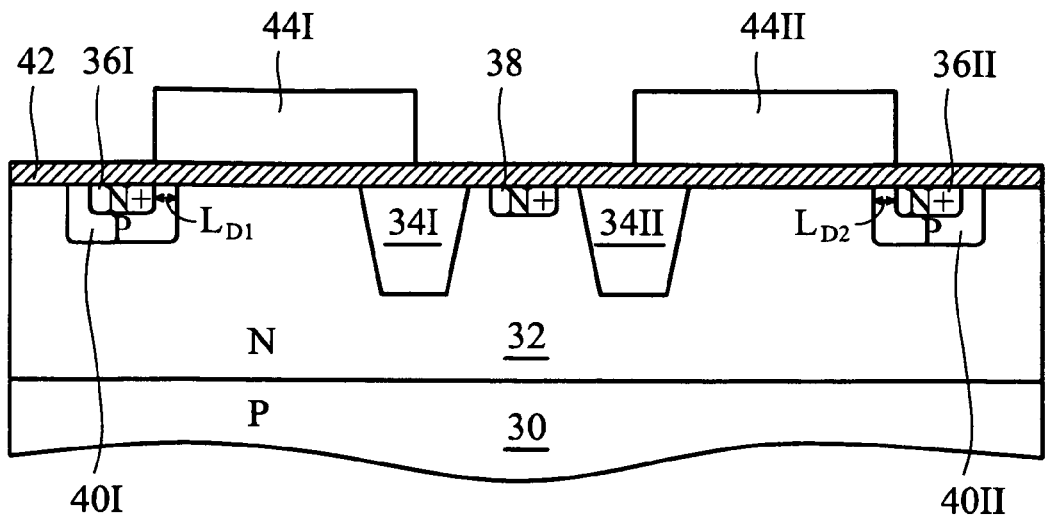
FIG. 3 is a sectional diagram of an LDMOS transistor of the present invention.
Figure 4:
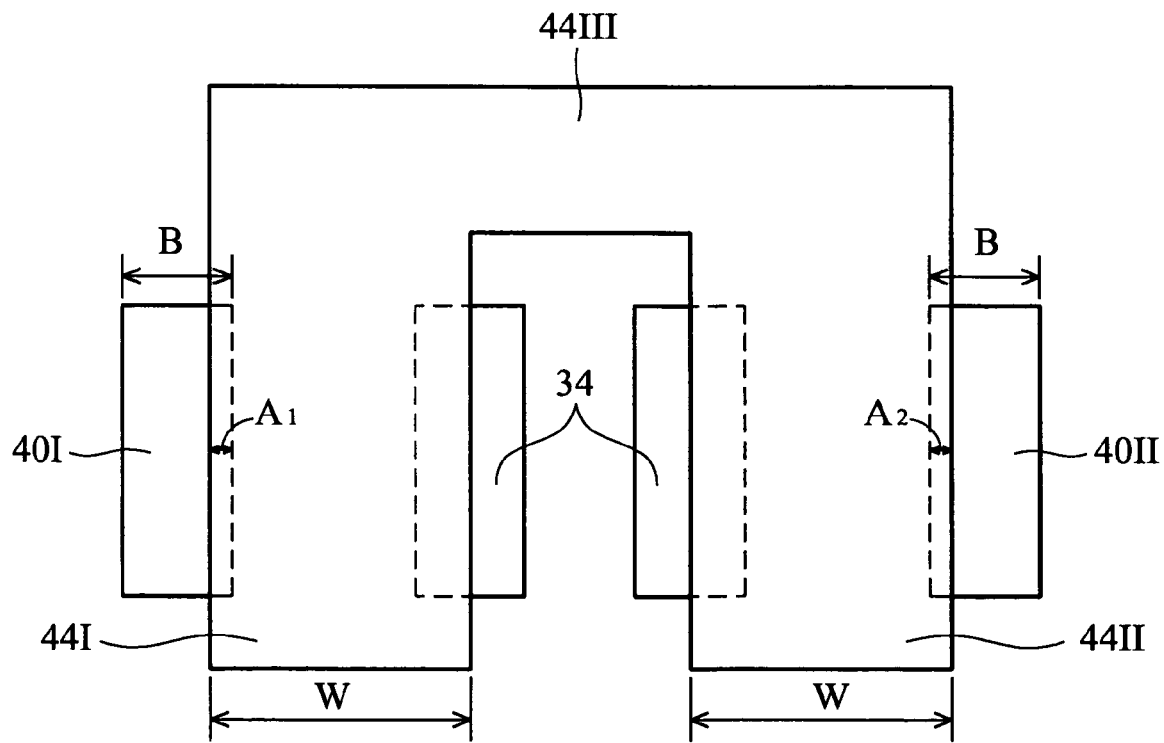
FIG. 4 is a plane view of a gate layer and P bodies of the present invention.

FIG. 3 is a sectional diagram of an LDMOS transistor of the present invention. FIG. 4 is a plane view of a gate layer and P bodies of the present invention.

In a case of a high-voltage area of a P-type semiconductor silicon substrate 30, an N-type silicon layer 32 is provided thereon, and a first STI structure 34I and a second STI structure 34II are formed in the N-type silicon layer 32 to isolate components within the high-voltage area. The N-type silicon layer 32 may be an N-type epitaxial layer or an N-type well layer. Also, the N-type silicon layer 32 comprises a first $N^+$-type source region 36I at a left side of the first STI structure 34I, a second $N^+$-type source region 36II at a right side of the second STI structure 34II, a $N^+$-type drain region 38 between the first STI structure 34I and the second STI structure 34II. Moreover, the N-type silicon layer 32 comprises a first P body 40I surrounding the sidewalls and bottom of the first $N^+$-type source region 36I, and a second P body 40II surrounding the sidewalls and bottom of the second $N^+$-type source region 36II. Furthermore, a gate insulating layer 42 is deposited on the N-type silicon layer 32, and a gate layer 44 is patterned on the gate insulating layer 42. Preferably, the gate layer 44 is a polysilicon layer.

The gate layer 44 of a horseshoe-shaped profile is constituted by connecting a first lengthwise-extending area 44I, a second lengthwise-extending area 44II and a transverse-extending area 44III. The first $N^+$-type source region 36I and the first P body 40I are disposed at the left periphery of the first lengthwise-extending area 44I, the second $N^+$-type source region 36II and the second P body 40II are disposed at the right periphery of the second lengthwise-extending area 44II, and the $N^+$-type drain region 38 and the two STI structures 34I and 34II are disposed between the two lengthwise-extending areas 44I and 44II. Accordingly, the first P body 40I has a lateral extension distance $L_{D1}$ beneath the first lengthwise-extending area 44I, and the second P body 40II has a lateral extension distance $L_{D2}$ beneath the second lengthwise-extending area 44II, thus the sum of $L_{D1}$ and $L_{D2}$ is defined as an effective channel length $L_D$ of the LDMOS transistor, that is, $L_D = L_{D1} + L_{D2}$.

Figure 1:
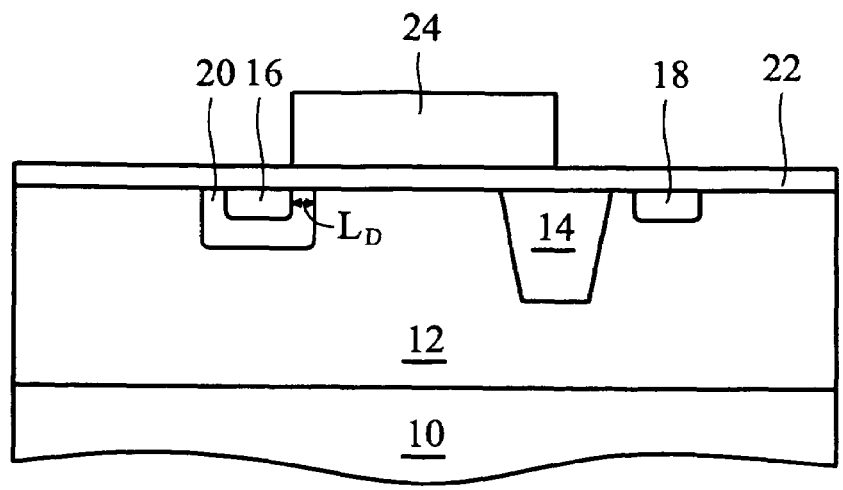
FIG. 1 is a sectional diagram of a conventional LDMOS transistor.
Figure 2:
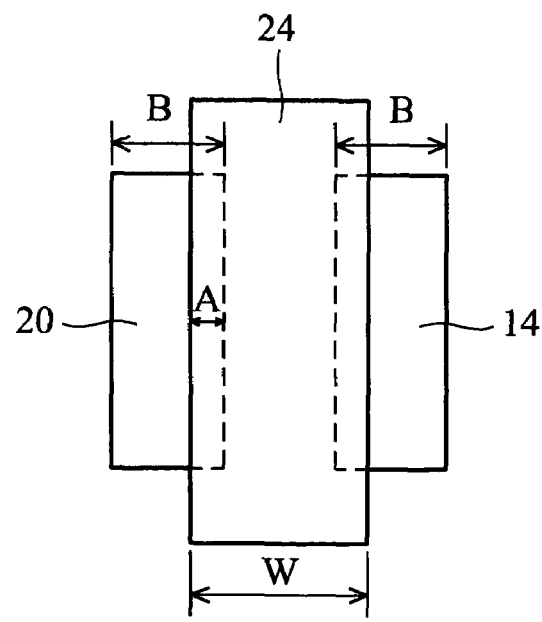
FIG. 2 is a plane view of the gate layer and the P body shown in FIG. 1.

Both the first lengthwise-extending area 44I and the second lengthwise-extending area 44II have an identical width W. Both the first P body 40I and the second P body 40II have an identical width B. The left periphery of the first lengthwise-extending area 44I overlaps the periphery of the first P body 40I to provide a first overlapping width $A_1$, and right periphery of the second lengthwise-extending area 44II overlaps the periphery of the second P body 40II to provide a second overlapping width $A_2$. If the limitations in small-size design and thermal budget make the two overlapping portions shift, the first overlapping width $A_1$ and the second overlapping width $A_2$ can compensate for the loss of each other. This keeps the sum of $A_1$ and $A_2$ constant to satisfy the formula: $A_1 + A_2 = A$, wherein A is the conventional overlapping width shown in FIG. 2.

When the width W of the lengthwise-extending areas 44I and 44II of the gate layer 44 is narrowed to reach 0.35 μm or 0.25 μm, the reduced thermal budget or the exposure limitation may suppress the vertical-diffusing distance and the lateral-diffusing distance of the P bodies 40I and 40II, resulting in a shift of the first overlapping portion or a shift of the second overlapping portion. The first overlapping width $A_1$ and the second overlapping width $A_2$ can compensate for the loss of each other to keep the sum of $A_1$ and $A_2$ constant A, thus precisely controlling the effective channel length $L_D (L_D = L_{D1} + L_{D2})$.

According to the above-described structure of the LDMOS transistor, one fabrication method thereof is to pattern the horseshoe-shaped gate layer 44 prior to the ion implantation and thermal treatment for the P bodies 40I and 4II, and the other fabrication method is to complete the P bodies 40I and 40II prior to the deposition, photolithography and etching for the horseshoe-shaped gate later 44.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A structure for an LDMOS transistor, comprising:
    a semiconductor silicon substrate having a surface region of a first conductive type;
    a horseshoe-shaped gate layer formed on the semiconductor silicon substrate, in which the gate layer comprises a transverse-extending area, a first lengthwise-extending area connected to a left end of the transverse-extending area and a second lengthwise-extending area connected to a right end of the transverse-extending area;
    a first source region of the first conductive type formed in the surface region of the semiconductor silicon substrate and disposed at the left periphery of the first lengthwise-extending area of the gate layer;
    a second source region of the first conductive type formed in the surface region of the semiconductor silicon substrate and disposed at the right periphery of the second lengthwise-extending area of the gate layer;
    a first drain region of the first conductive type formed in the surface region of the semiconductor silicon substrate and disposed between the first lengthwise-extending area and the second lengthwise-extending area of the gate layer;
    a first ion-diffusion body of a second conductive type formed in the surface region of the semiconductor silicon substrate and surrounding the sidewalls and bottom of the first source region; and
    a second ion-diffusion body of a second conductive type formed in the surface region of the semiconductor silicon substrate and surrounding the sidewalls and bottom of the second source region;
    wherein, the left periphery of the first lengthwise-extending area of the gate layer overlaps the periphery of the first ion-diffusion body to form a first overlapping portion, and the right periphery of the second lengthwise-extending area of the gate layer overlaps the periphery of the second ion-diffusion body to form a second overlapping portion.

2. The structure for an LDMOS transistor of claim 1, wherein the first conductive type is N type, and the second conductive type is P type.

3. The structure for an LDMOS transistor of claim 1, wherein the first ion-diffusion body and the second ion-diffusion body are $P^+$-type.

4. The structure for an LDMOS transistor of claim 1, further comprising:
    a first isolation region formed in the surface region of the semiconductor silicon substrate and disposed at the right periphery of the first lengthwise-extending area of the gate layer; and
    a second isolation region formed in the surface region of the semiconductor silicon substrate and disposed at the left periphery of the second lengthwise-extending area of the gate layer;

wherein, the drain region is disposed between the first isolation region and the second isolation region.

5. The structure for an LDMOS transistor of claim 1, wherein the gate layer is a polysilicon layer.

6. The structure for an LDMOS transistor of claim 1, wherein the surface region of the semiconductor silicon substrate is an N-type epitaxial layer.

7. The structure for an LDMOS transistor of claim 1, further comprising:
a gate insulating layer sandwiched between the surface region of the semiconductor silicon substrate and the gate layer.

* * * * *